United States Patent [19]

Duggan

[11] Patent Number: 5,828,685
[45] Date of Patent: Oct. 27, 1998

[54] SEMICONDUCTOR LASER DEVICE AND A METHOD OF GROWING A SEMICONDUCTOR LASER DEVICE

[75] Inventor: Geoffrey Duggan, Oxfordshire, United Kingdom

[73] Assignee: Sharp Kabushiki Kaisha, Osaka, Japan

[21] Appl. No.: 773,075

[22] Filed: Dec. 26, 1996

[30] Foreign Application Priority Data

Dec. 29, 1995 [GB] United Kingdom .................... 9526631

[51] Int. Cl.$^6$ ................................................ H01S 3/19
[52] U.S. Cl. ............................................................ 372/45
[58] Field of Search .................................. 372/45, 46, 96, 372/43, 44; 437/81; 357/16, 17

[56] References Cited

U.S. PATENT DOCUMENTS

| | | | |
|---|---|---|---|
| 4,855,250 | 8/1989 | Yamamoto et al. | 437/81 |
| 4,977,568 | 12/1990 | Yamamoto et al. | 372/46 |
| 5,036,521 | 7/1991 | Hatakoshi et al. | 372/46 |
| 5,144,633 | 9/1992 | Ohnaka et al. | 372/45 |
| 5,467,364 | 11/1995 | Muro et al. | 372/45 |
| 5,703,899 | 12/1997 | Mizutani | 372/96 |

FOREIGN PATENT DOCUMENTS

| | | |
|---|---|---|
| 0183146 | 6/1986 | European Pat. Off. . |
| 0540799 | 5/1993 | European Pat. Off. . |
| 03276785 | 12/1991 | Japan . |
| 2099624 | 12/1982 | United Kingdom . |

OTHER PUBLICATIONS

D. P. Bour et al., IEEE Journal of Quantum Electronics, vol. 30, No. 2, pp. 593–606, Feb. 1994, "Strained $Ga_xIn_{1-x}P/(AlGa)_{0.5}In_{0.5}P$ Heterostructures and Quantum–Well Laser Diodes".

K. Kishino et al., Applied Physics Letters, vol. 58, No. 17, pp. 1822–1824, Jan. 1991, "Enhanced carrier confinement effect by the multiquantum barrier in 660 nm GaInP/AlInP visible lasers".

A. Zrenner et al., Proceedings of the 17th Inernational Conference on the Physics of semiconductors, pp. 325–328, 1984, "Electron Subband Structure of A $\delta(z)$–Doping Layer in n–GaAs". No month.

M. Nakajima et al., Journal of Crystal Growth, vol. 105, pp. 116–123, Jan. 1990, "Study of AlInP and GaInP Grown by Gas Source Molecular Beam Epitaxy (GSMBE)".

Oxford University Press, Rectifying Semiconductor Contacts, pp. 216–217, 1978, "Diffusion of electrons and positive holes". No month.

K. Iga et al., Electronics Letters, vol. 22, No. 19, pp. 1008–1010, Sep. 1986, "Electron Refectance of Multiquantum Barrier (MQB)".

H. Hamada et al., Electronics Letters, vol. 28, No. 19, pp. 1834–1836, 1992, "Room–Temperature CW Operations of 610nm Band AlGaInP Strained Multiquantum Well Laser Diodes with Multiquantum Barrier".

Search Report for Application No. GB 9526631.8; dated Feb. 29, 1996.

Mikulla, et al., "High Power Tapered InGaAs/GaAs Laser Diodes with Carbon Doped Cladding Layers Grown by Solid Source Molecular Beam Epitaxy", presented at 22nd International Symposium on Compound Semiconductors, Cheju Island, Korea, Inst. Phys. Conf. Ser. No. 145; Chapter 8, pp. 995–998, Aug. 28–Sep. 2, 1995.

European Search Report dated May 28, 1997, for European Patent Application No. 96309537.7.

*Primary Examiner*—Rodney B. Bovernick
*Assistant Examiner*—Ellen Eunjoo Kang
*Attorney, Agent, or Firm*—Renner, Otto, Boisselle & Sklar

[57] ABSTRACT

A semiconductor laser device includes an active region, a cladding region, and a carrier blocking layer of the same conductivity type as the cladding region disposed on tho same side of the active region as the cladding region. The carrier, blocking layer has a greater impurity concentration than the cladding region.

9 Claims, 4 Drawing Sheets

SEMICONDUCTOR LASER DEVICE AND A METHOD OF GROWING A SEMICONDUCTOR LASER DEVICE

This invention relates to a semiconductor laser device and a method of growing a semiconductor laser device, in particular to a semiconductor laser device which emits visible radiation in the wavelength range 630 nm to 680 nm.

Laser devices or laser diodes (LDs) fabricated in the (AlGaIn)P materials systems which emit visible light in the 630 nm–680 nm wavelength range are becoming increasingly important components of professional and consumer products. For example, it is envisaged that the Digital Video Disk (DVD) system will require a 635 nrm wavelength LD capable of delivering 5 mW output power up to a temperature of 60° C. The next generation of semiconductor lasers will need an even greater maximum power output within the same temperature range.

A principal limitation of current laser diodes is that they are incapable of operating for long periods (or with a sufficiently low threshold current) at the highest specified Operating temperature. It is generally believed that this is caused by carriers leaking from the active region of the device into the surrounding guiding and cladding regions.

So far, two methods have been employed to try and reduce this carrier leakage, namely (1) increased doping in the cladding layer, and (2) use of a Multiple Quantum Well Barrier (MQB) in the cladding layer. Both of these methods, which are described in "IEEE Journal of Quantum Electronics" Vol 30, pages 593–606 (1994), have disadvantages.

FIG. 1 shows the conduction and valence band energies ($E_C$, $E_v$) of a separate confinement heterostructure (SCH) laser device. The diagram shows the active layer 1, an optical guiding layer 2 and a p-type cladding layer 3 under operating conditions. The electron leakage current consists of electrons which have sufficient thermal energy to surmount the potential barrier on the right hand side of the diagram and move into the p-type cladding layer 3. If the doping level of the p-type cladding layer is increased the potential barrier increases from $\Delta\epsilon_1$ to $\Delta\epsilon_2$. However, there are practical limitations to the amount Of p-doping which can be incorporated into (AlGaIn)P or (AlIn)P cladding regions. This is particularly true of MOCVD grown materials where a maximum impurity concentration of approximately $2 \times 10^- cm^{-3}$ can he achieved using either Zn or Mg. An example of this Is given in IFEE Journal of Quantum Electrons, Vol. 30, No. 2, pages 593–606 (1994) However, any further increase in dopant concentration using this technique causes the dopant to diffuse into the active region of the device, thereby degrading its performance.

The principle of operation of the MQB is illustrated in FIGS. 2(*a*) and 2(*b*). FIG. 2(*a*) shows the conduction band energy of a SCH laser structure incorporating a MQB 4 in the p-type cladding layer. The MQB consists of very thin (a few monolayers thick) alternating layers of, for example, (InGa)P and (InGaAl)P. An electron which has sufficient thermal energy to escape from the SCH structure will be quantum mechanically reflected at each of the interfaces of the MQB. If the layer thicknesses are chosen tube λ/4 in thickness, where λ is the electron wavelength, then the quantum mechanical reflectivity of the MQB will be close to 1. This is shown in FIG. 2(*b*), in which the broken and full lines respectively represent the classical reflectivity and the difference between the classical and the quantum mechanical calculation of the reflectivity. It is clear that the reflectivity is close to 1 for electrons with energies well above the classical barrier height $\Delta\epsilon$.

MQB reflectors appear to reduce the temperature dependence of the threshold current for short wavelength lasers (for example, "Applied Physics Letters", Vol 58, pages 1822–1824 (1991)). The effectiveness of MQB reflectors is, however, usually inferred from the characteristics of a laser device rather than from a direct measurement of the enhancement of the barrier height. It is thus difficult to establish what advantage has accrued from the use of an MQB reflector in comparison to any advantage that might have occurred simply due to better processing or better material quality. Furthermore, it should be noted that an MQB is only effective if the coherence length of the electron is long. Anything which destroys this coherence, such as interface scattering, will reduce the reflectivity significantly.

GB-A-2099624 discloses a light emitting device wherein barrier layers with unspecified dopant (impurity) levels are provided between the active layer and respective cladding layer of opposite conductivity type. The barrier layers prevent carrier migration from the active layer so that the refractive index step between the active and cladding layers can be small. Such barrier layers are of the-same general alloy composition, $Al_xGa_{1-x}As$, as the respective cladding layers, but with x being greater in the barrier layers than in the respective cladding layers, so that the barrier layers have bandgaps which are greater than the respective cladding layers. The barrier layers may be compositionally graded.

EP-A-0540799 discloses AlGaInP diodes in which, to avoid defect formation when growing thick AlGaInP cladding layers by MOVPE on a slightly misorientated GaAs substrate (and thereby reduce the risk of catastrophic optical damage in use), the usual thick p- and n-doped AlGaInP layers are replaced by thick AlGaAs layers and very thin AlGaInP barrier layers which just avoid tunneling and spill over of carriers from the active region. Such very thin AlGaInP layers are disclosed as having dopant (impurity) concentrations which are less than in tho respective AlGaAs layers.

According to the present invention there is provided a semiconductor laser device comprising: an active region; a cladding region; and a carrier blocking layer on the same conductivity type as the cladding region disposed on the same side of the active region as the cladding region, characterised in that the carrier blocking layer has a greater impurity concentration than the cladding region.

The carrier blocking layer has a high impurity concentration and this increases the potential barrier for the carriers, thereby decreasing the leakage current through the cladding region and reducing the temperature dependence of the threshold current. There is only a relatively narrow region where the impurity concentration is high, in contrast to the structure shown in FIG. 1 in which the impurity concentration is high throughout the whole cladding region. Furthermore, the increased barrier height does riot depend on the coherence of the electron wavefunction.

In a preferred embodiment, the laser device is an SCH laser with an optical guiding region disposed between the cladding region and the active region so as to form a heterojunction therebetween. Whilst it is possible to provide the carrier blocking layer in the cladding region at the heterojunction, the carrier blocking layer is preferably provided in the optical guiding region at the heterojunction because the optical guiding region is normally undoped and so the increase in the conduction band energy caused by the presence of the carrier blocking layer is much more pronounced than would be the case if the carrier blocking layer were to be provided in the already heavily doped cladding region.

The carrier blocking layer is most preferably a sheet doped layer, i.e. a layer comprised solely of the impurity.

Preferably the thickness of the carrier blocking layer is in the range 5 to 20 nm.

In a preferred embodiment the impurity in the cladding region and the carrier blocking layer are p-type impurities In a preferred embodiment the impurity concentration of the carrier blocking layer is not less than $10^{19}$ cm$^{-3}$.

In a preferred embodiment the laser device is constructed from (AlGaIn)P materials.

The present invention also provides a method of growing a semiconductor laser device comprising an active region, a cladding region, and a carrier blocking layer of the same conductivity type as the cladding region disposed on the same side of the active region as the cladding region, tie method comprising the steps of growing the active region; growing the carrier blocking layer; and growing the cladding region, characterised in that the carrier blocking layer is grown so as to have a greater impurity concentration than the cladding region.

Preferably, an optical guiding region is grown between the active region and the cladding region so as to form a heterojunction between the optical guiding region and the cladding region, and the carrier blocking layer is grown at the heterojunction.

Whilst the carrier blocking layer may be grown in the cladding region, the carrier blocking layer is most preferably grown in the optical guiding region.

Preferred embodiments of the invention will now be described in detail with reference to the accompanying Figures in which FIG. 1 is a schematic diagram of the conduction and valence band energies of a conventional SCH semiconductor laser device;

Figure 1:
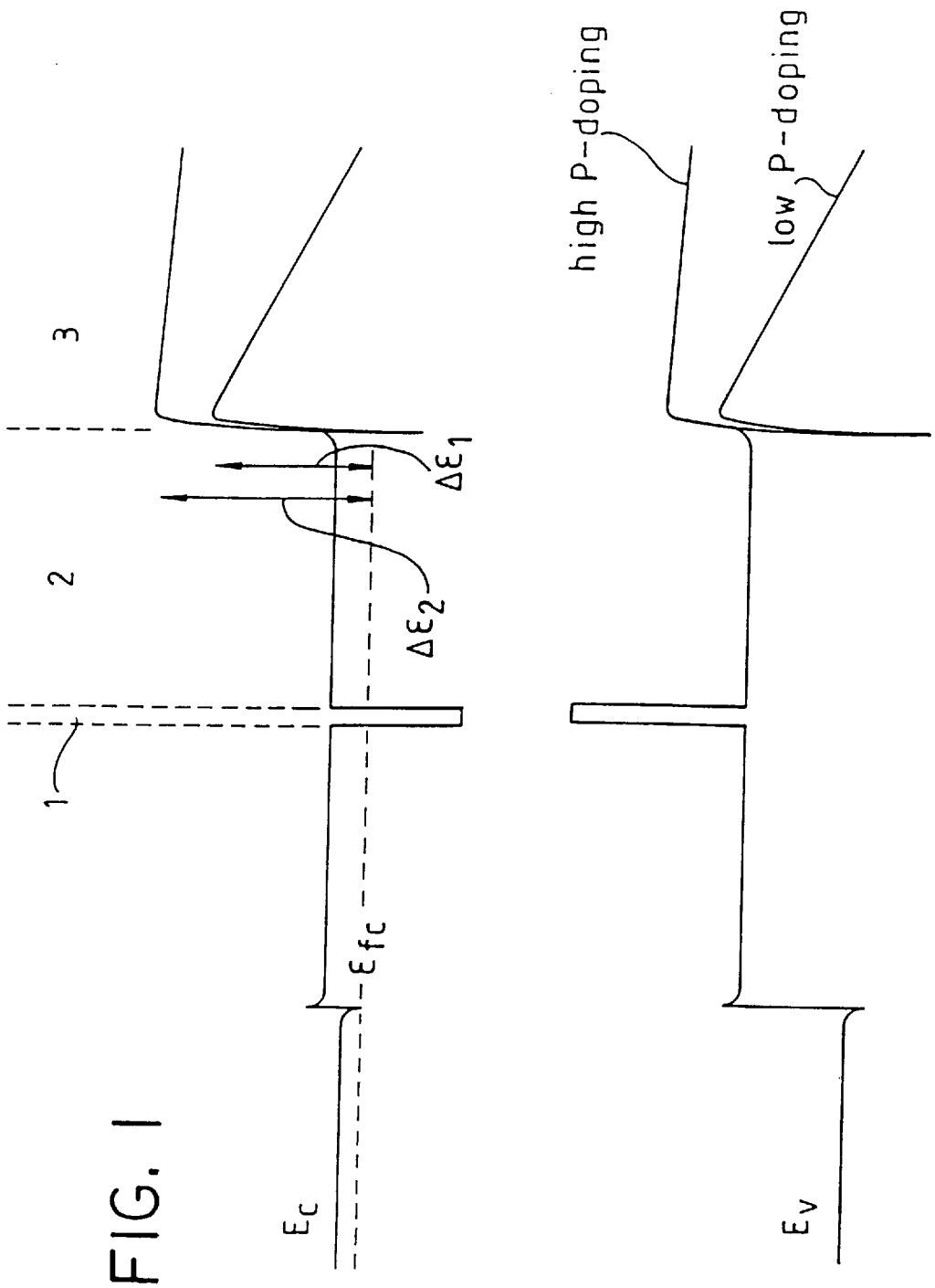
Figure 2A:
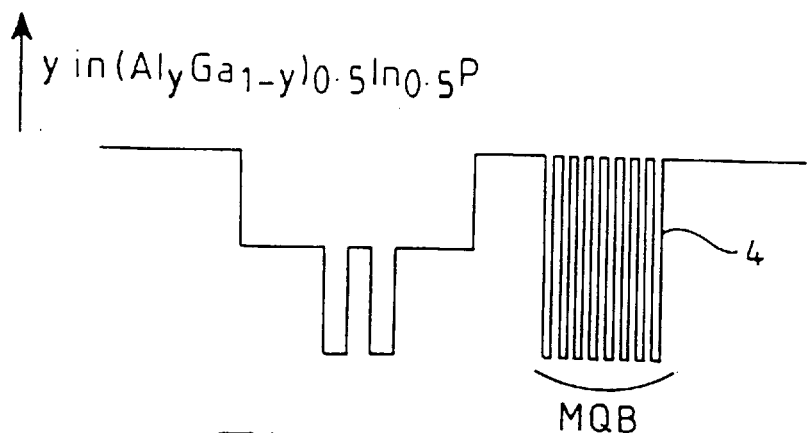
FIG. 2(a) is a schematic diagram of the conduction band energy of a conventional SCH semiconductor laser device provided with an MQB region.
Figure 2B:
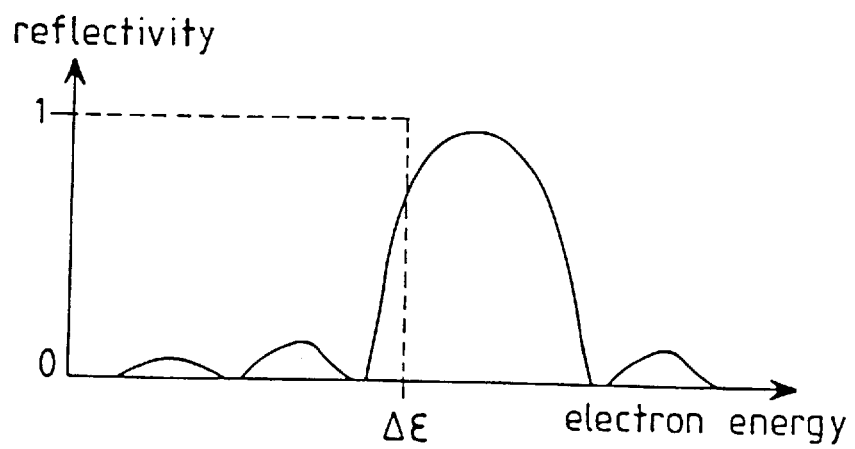
FIG. 2(b) shows the reflectivity of the MQB region of the laser device of FIG. 2(a)
Figure 3:
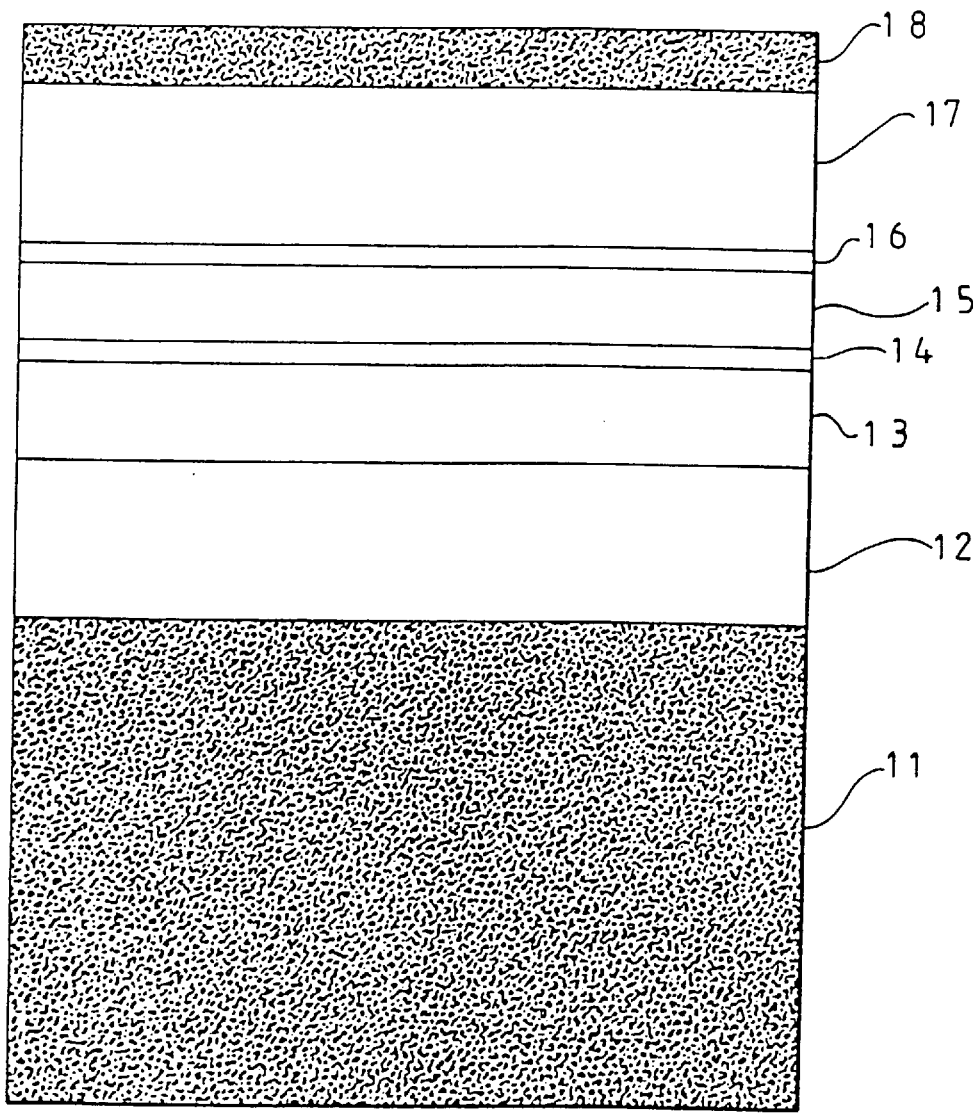
FIG. 3 is a schematic diagram of a semiconductor laser device according to an embodiment of the present invention.

A preferred embodiment of the invention is shown in FIG. 3. This is a schematic diagram of the layer structure of an edge-emitting SCH laser device. An (AlGa)InP n-type cladding layer 12 is grown on a n-type Gads substrate 11, and an (AlGa)InP optical guiding layer 13 is grown on the cladding layer 12.

The active layer 14 can be either a (InGa)P single quantum well or a (InGa)P/(InGaAl)P multiple quantum well layer. An (AlGa)InP optical guiding layer 15, a (AlGa)InP p-type cladding layer 17 and a p-type GaAs capping layer 18 are grown on the active layer 14.

Reference numeral 16 denotes a thin, heavily p-type doped layer. This layer will be referred to as a "δ-doped layer". The effect of this layer can be understood with reference to FIGS. 4(a), 4(b) and 4(c).

Figure 4A:
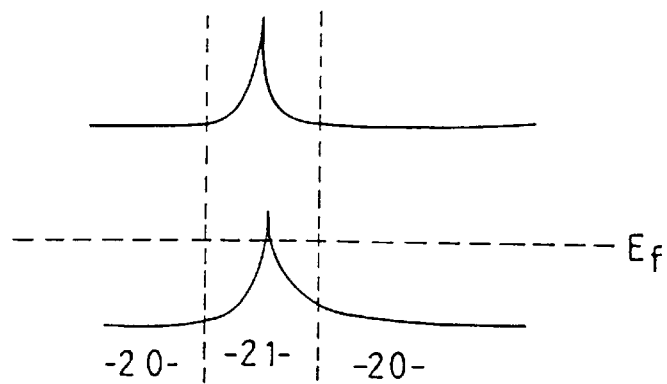
FIG. 4(a) is a schematic diagram of the conduction and valence bands of a semiconductor region incorporating a heavily p-type doped layer.

FIG. 4(a) shows the effect of inserting a p-type δ-doped layer 21 in an otherwise uniformly doped p-type layer 20.

The need to equalise the Fermi level $E_f$ through the structure causes strong band bending in the vicinity of the δ-doped layer. This results in the appearance of a "spike" in the conduction band and valence band edges. The spike in the conduction hand forms a barrier to electron transport from one side of the structure to the other. The width of the spike is of the order of 10 nm.

Figure 4B:
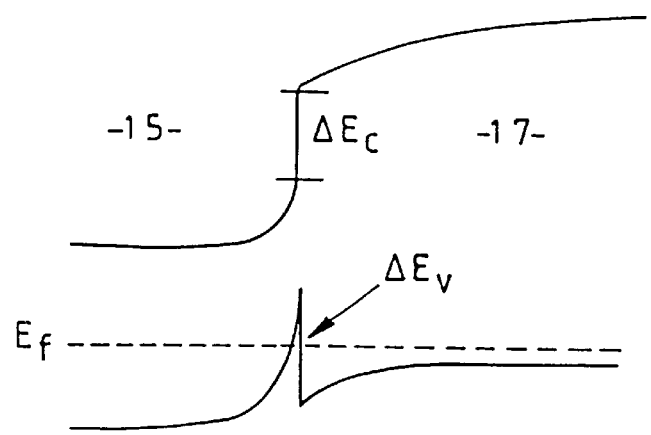
FIG. 4(b) is a schematic diagram of the conduction and valence bands of a laser at the interface-between an optical guiding region and a cladding region.

FIG. 4(b) shows the conduction and valence bands that would occur in the vicinity of the interface between the upper optical guiding layer 15 and the p-type cladding layer 17 of the laser of FIG. 3 in the absence of the δ-doped layer. The step in the conduction band energy $\delta F_c$ is a barrier to electrons.

Figure 4C:
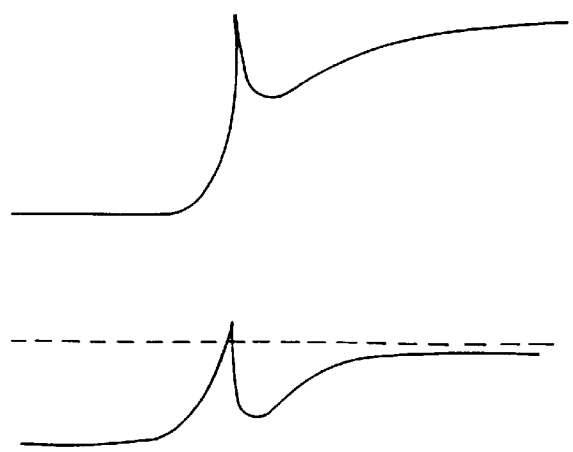
FIG. 4(c) is a schematic diagram of the conduction and valence bands of a laser at the interface between an optical guiding region and a cladding region when a heavily p-type doped layer is provided.

If δ-doped layer which is doped p-type is provided at the interface between the optical guiding layer 15 and the cladding layer 17 the resultant conduction and valence bands, shown in FIG. 4(c), are essentially a combination of the bands shown in FIGS. 4(a) and 4(b). There Is an enlarged potential barrier in the conduction band and this reduces the leakage of electrons from the active layer into the p-type cladding layer.

A δ-doped layer, also known as a sheet-doped layer, is formed when growth of a bulk semiconductor layer is interrupted, and only dopant species are supplied to the substrate For example, a δ-doped layer can be produced if the growth of n-type Gas (n ~5×10$^{15}$cm-$^{31}$ $^3$) is interrupted for a period of 20–400 sec whilst only Si atoms are supplied to the substrate. This results in an increase in the two dimensional doping level of the GaAs to a value equivalent to 2×10$^{18}$ cm$^3$ (for The bulk Si). This, in turn, produces a change in the electrostatic potential of around 180 meV, and this change occurs over a distance of approximately 20 nm. The production of such a δ-doped layer is described in "Proceedings of 17th International Conference on the Physics of Semiconductors", San Francisco, 1984, p325–328. Although this example refers to the growth of n-type layers, a similar effect would be expected with a p-type dopant. Be or C could be used as dopants.

For maximum effect the δ-doped layer should be inserted in the optical guiding layer at the interface between the optical guiding layer and the cladding layer. Ideally, the δ-doped layer should have as large a doping density as possible without degrading the quality of the host crystal. In practice it is found that there is significant diffusion of dopant in MOCVD grown material when dopant levels exceed 2×10$^{18}$cm$^{-3}$. Such a problem is not generally encountered in growth by either MBE or gas source MBE (GSMBE).

A further limitation on the maximum impurity density Is that, when one tries to increase the amount of dopant in (AlGaIn)P materials, the doping eventually becomes degenerate and so the p-doping level has to be increased by large amounts to shift the Fermi level significantly. For example, In "Journal of Crystal Growth", Vol. 105, p116(1990) it is shown that for (AlIn)P it is not possible to increase the doping level above about 10$^{10}$ cm by either MOCVD or MBE, whereas a practical limit for GSMBE material seems to be about a factor of 5 larger. (These are practical limits for bulk materials.)

It is possible to estimate the expected enhancement of the barrier height by calculating the change in the electrostatic potential. The change in the electrostatic potential is given by:

$$\Psi \times -26*(T/300)ln(P_\delta/P_{bulk})(\text{meV}) \qquad (1)$$

$P_{\delta,bulk}$ are the doping levels of the δ-doped and bulk layers respectively and T is the sample temperature in degrees Kelvin ("Semiconductors"(2nd edition) p217, 1978).

If the δ-doped layer has an equivalent p-type doping level of $10^{19}$ cm$^3$ and the undoped guiding layer has a background doping level of $5\times10^{15}$ cm$^{-3}$ equation (1) gives a change in the electrostatic potential of approximately 198 meV at T=300K. This compares with 155 meV if the δ-doped layer were omitted and the transition were to a bulk layer doped at $2\times10^{18}$ cm$^{-3}$. This means that in additional barrier height of about 40 meV can be realised using the δ-doped layer. This increase would be as much as 130 meV if a two dimensional doping level equivalent to $10^{20}$ cm$^-$ could be realised in the δ-doped layer.

Although the above laser device and method of growth have been described in the context of an edge-emitting laser device, the present invention is not intended to be limited to edge-emitting laser devices alone. It is conceivable that the above described features can be incorporated into other laser device, for example, surface-emitting laser devices.

What is claimed is:

1. A semiconductor laser device comprising:
   an active region;
   a cladding region; and
   a carrier blocking layer of the same conductivity type as the cladding region disposed between the active region and the cladding region,
   wherein the carrier blocking layer has a greater impurity concentration that the cladding region.

2. A semiconductor laser device as claimed in claim 1, further comprising an optical guiding region disposed between the cladding region and the active region so as to form a heterojunction therebetween, the carrier blocking layer being provided at the heterojunction.

3. A semiconductor laser device as claimed in claim 2, wherein the carrier blocking layer is provided in the optical guiding region.

4. A semiconductor laser device as claimed in claim 1, wherein the carrier blocking layer is provided in the cladding region.

5. A semiconductor laser device as claimed in claim 1, wherein the carrier blocking layer comprises a sheet-doped layer.

6. A semiconductor laser device as claimed in claim 1, wherein the thickness of the carrier blocking layer is in the range 5 nm to 20 nm.

7. A semiconductor laser device as claimed in claim 1, wherein the cladding region and the carrier blocking layer are doped with p-type impurities.

8. A semiconductor laser device as claimed in claim 1, wherein the impurity concentration-of, the carrier blocking layer is not less then $10^{10}$ cm$^{-3}$.

9. A semiconductor laser device as claimed in claim 1, wherein the device is a (AlGaIn)P laser.

* * * * *